United States Patent [19]
Morich

[11] Patent Number: 5,296,810
[45] Date of Patent: Mar. 22, 1994

[54] MRI SELF-SHIELDED GRADIENT COILS

[75] Inventor: Michael A. Morich, Mentor, Ohio

[73] Assignee: Picker International, Inc., Highland Hts., Ohio

[21] Appl. No.: 942,521

[22] Filed: Sep. 9, 1992

Related U.S. Application Data

[63] Continuation-in-part of Ser. No. 859,152, Mar. 27, 1992, and a continuation-in-part of Ser. No. 859,154, Mar. 27, 1992.

[51] Int. Cl.$^5$ ............................................. G01R 33/20
[52] U.S. Cl. ..................................... 324/318; 324/319
[58] Field of Search ............... 324/300, 307, 309, 310, 324/311, 312, 313, 314, 318, 319, 320, 322; 335/299

[56] References Cited

U.S. PATENT DOCUMENTS

| | | | |
|---|---|---|---|
| 4,733,189 | 3/1988 | Punchard et al. | 324/318 |
| 4,737,716 | 4/1988 | Roemer et al. | 324/319 |
| 4,876,510 | 10/1989 | Siebold et al. | 324/318 |
| 4,881,035 | 11/1989 | Siebold | 324/320 |
| 4,896,129 | 1/1990 | Turner et al. | 335/299 |
| 4,905,316 | 2/1990 | Okamoto | 324/319 |
| 4,978,920 | 12/1990 | Mansfield et al. | 324/318 |
| 5,132,618 | 7/1992 | Sugimoto | 324/318 |

FOREIGN PATENT DOCUMENTS 2180943A of 0000 United Kingdom .

OTHER PUBLICATIONS

"Active Magnetic Screening of Gradient Coils in NMR Imaging", Mansfield, et al., Journal of Magnetic Resonance 66, 573-576 (1986).
"Active Magnetic Screening of Coils for Static and Time-Dependent Magnetic Field Generation in NMR Imaging", Mansfield, et al., J. Phys. E. Sci. Instrum. 19 (1986).
"Minimum Inductance Coils", Turner, J. Phys. E. Sci. Instrum. 21 (1988) 948-952.

Primary Examiner—Michael J. Tokar
Attorney, Agent, or Firm—Fay, Sharpe, Beall, Fagan, Minnich & McKee

[57] ABSTRACT

A superconducting magnetic imaging apparatus includes a vacuum vessel (40) having a central helium reservoir (48) in which superconducting magnetic coil windings (44) are maintained at a superconducting temperature. The vacuum vessel defines an internal bore (42) within which a self-shielded gradient coil assembly (14) and an RF coil (22) are received. The self-shielded coil assembly includes an inner former (60) which defines an imaging region (12) within which an imaged portion of the patient are received. X and y-gradient coils having winding patterns (62) are bonded to the former (60) forming an integral structure. A z-gradient coil (70) is mounted to mechanical reinforcement structure (72) to be held in a spaced relationship from the x and y-gradient coils with an air gap (74) in between. This facilitates the dissipation of heat generated by the large current pulses applied to the x and y-gradient coils. An outer former (80) of larger diameter than the z-gradient coils is received in the bore and supports the inner former therein. X, y, and z-gradient secondary or shielding coils (82, 84) are bonded to the outer former for preventing the gradients generated by the primary gradient coils from inducing gradient eddy currents in the vacuum vessel and the structures contained therein.

10 Claims, 7 Drawing Sheets

MRI SELF-SHIELDED GRADIENT COILS

The present application is a continuation-in-part of U.S. application Ser. Nos. 07/859,152 and 07/859,154, both filed Mar. 27, 1992.

BACKGROUND OF THE INVENTION

The present invention relates to the magnetic resonance art. It finds particular application in conjunction with gradient coils for magnetic resonance imaging apparatus and will be described with particular reference thereto. However, it is to be appreciated that the present invention will also find application in conjunction with magnetic resonance spectroscopy systems and other applications which require gradient magnetic fields.

In a magnetic resonance imaging system, the gradient coils are commonly pulsed with current pulses having a short rise time and a high duty cycle. Pulsing the gradient coils produces magnetic field gradients across the imaging region, as well as magnetic field gradients which interact with external metallic structures such as cold shields in a superconducting magnet. This interaction generates eddy currents in the cold shields, which, in turn, generate eddy magnetic fields. The eddy fields have a deleterious effect on the temporal and spatial quality of the magnetic field in the examination region, hence in the resultant image quality.

One approach to circumventing the eddy current problem is to place a shielding coil between the gradient coil and the cold shields. The shielding coils are designed to substantially zero the magnetic field externally of themselves, preventing the formation of eddy currents. However, the shield coil inductively couples with the gradient coil, draws power, and reduces gradient coil efficiency. The required additional current through the gradient coil increases the already high demands on the driving circuit and the power handling capacity of the coils.

More specifically, gradient coils are typically a three-layered coil set that is formed on a cylindrical former. Coils for generating x, y, and z-gradients are insulated from each other and layered on the former. Commonly, the entire assembly is overwrapped and epoxy impregnated for greater structural strength to withstand the warping forces when the current carrying conductors interact with the primary magnetic field.

Various techniques have been employed to derive suitable conductor patterns for the gradient coils. Some gradient coil assemblies use a "distributed" coil design in which the conductors approximate a continuous current distribution function. Other coils begin with a discrete set of conductors which are closely bunched to one another. In both the distributed and bunched coils, the patterns are designed to meet specified electromagnetic design goals, particularly a linearity of the gradients with a minimal energy usage. To achieve these design goals, the radius of each coil is minimized. Minimizing the radius requires placing the coil layers close together in the radial direction. In some designs, the z-gradient coil, which is inherently the most efficient, is placed at the smallest radius. Confining the three coils in such close proximity creates numerous problems in design, fabrication, heat dissipation, and the like.

In order to simplify the system design of gradient shield coils, it is advantageous to drive primary and secondary coils in series. This is often referred to as self-shielding. In self-shielded gradient coils, there are generally two cylindrical coil sets. The larger diameter coil set substantially cancels the magnetic field exterior to itself but interacts with the smaller diameter coil to subtract from the gradient field in the examination region. A mechanical means connects the coil sets into a unitary structure while maintaining the coil sets in a spaced relationship. This type of self-shielded coil again reduces coil efficiency and increases power dissipation.

One of the problems with closely layered x, y, and z-coils is that the currents cause a significant amount of heat in a small confined area. The overwrap and epoxy impregnation resist the transfer of heat from the coil assembly. Although the z-coil is inherently more efficient than the x and y-coil, placing the z-coil as either the innermost or outermost layer fails to take advantage of this greater efficiency from a thermal standpoint. When the z-coil is the innermost coil, it is a heat source closer to the patient bore. Since it is generally layered into machined grooves in the former. Alternately, the innermost placement of the z-coil increases the radius of the already least efficient x and y-coils. When the z-coil is in the outermost layer but physically close the x and y-coils, the z-coil and the epoxy and overwrap add a substantial heat barrier for removing heat from the x and y-gradient coils.

Such a two coil set self-shielded gradient coil is illustrated in U.S. Pat. No. 4,737,716 issued Apr. 12, 1988 to Roemer, et al. The Roemer design approach was to expand the current density stream functions in a suitable Fourier-type series and derive a set of expansion coefficients which yield the desired field gradient linearity and screening/shielding behavior. The described Roemer design is iterative in nature. That is, a winding pattern is designed for the inner coil in a direct fashion. The outer coil is then designed to cancel the exterior magnetic field of the inner coil which, of course, disturbs the linearity of the magnetic field. This requires adjusting the inner coil design to maintain the linearity requirements, which requires adjusting the outer coil design, etc.

one problem with the Roemer method is that it does not consider the inductance or stored magnetic energy in the coil in a direct fashion. This permits the coil design to hold more than a minimal amount of energy, which is energy inefficient and forces one to iteratively search for a solution which is deemed acceptable. Linear, but very inefficient coils can be generated. Further, this technique does not take advantage of the inherent higher efficiency of z-gradient coils.

Another technique for designing self-shielded gradient coils which seeks to minimize inductance or energy storage is described in "Minimum Inductance Coils", R. Turner, J. Phys. E. Sci. Instrum. (19), 1986. Two cylinders which are each assumed to have infinite length support continuous current density functions. Working in the spectral domain, the magnetic field is constrained at a finite number of points with the added constraint that the second cylinder is a superconducting boundary, i.e. the outer coil shields the surrounding structure from the magnetic field gradients. The stored magnetic energy is minimized with these constraints and a direct, analytic solution for the current distribution is obtained. The current distribution is then truncated to account for the finite length of the coils and discretized to produce a practical coil pattern.

One of the disadvantages of the Turner approach is that the coils are assumed to be of infinite length and then truncated. This creates aberrations in the resultant pattern and diminishes the effectiveness of the shielding, particularly adjacent the edges. Another disadvantage is that the field is defined only at a finite set of points. There is no direct control on how the magnetic field might behave between the points. Further, this technique does not take advantage of the greater efficiency found in z-gradient coils relative to x and y gradient coils.

A technique for designing bunched coils is set forth in U.K. Patent Application No. 2,180,943 of Mansfield, et al. and the corresponding U.S. Pat. No. 4,978,920. This published application provides sets of relationships which describe the induced current density in a superconducting cylinder due to the loops or arcs of segments of current flowing on a smaller diameter cylinder, i.e. the inner coil. However, this technique again fails to consider the inductance or stored energy. Moreover, this technique does not take advantage of the greater efficiency of the z-gradient coil.

Typically, x, y and z-gradient coils are mounted in concentric, bonded layers as illustrated in U.S. Pat. No. 4,713,189 to Punchard, et al. Active shield coils are mounted on three laminated layers of a concentric surrounding cylinder, one drawback of laminating the coils is that there is poor heat dissipation. The coils tend to heat, which can cause distortion of the physical structures and the resultant gradient or shielding magnetic fields.

The present invention contemplates a new and improved self-shielded gradient coil and method for designing such self-shielded gradient coil which overcomes the above-referenced problems and others.

SUMMARY OF THE INVENTION

In accordance with one aspect of the present invention, a superconducting magnetic resonance imaging system is provided which includes a self-shielded gradient coil assembly in the imaging bore. The self-shielded gradient coil assembly generates gradient magnetic fields across the imaging region while shielding surrounding components from such gradient magnetic fields. The self-shielded gradient coil assembly includes an outer former on which x, y, and z secondary shielding coils are mounted and an inner former on which primary x and y-gradient coils are mounted. The inner former has a sufficient diameter to receive a portion of a subject to be imaged therein. A z-gradient coil is spaced outward from the inner former and the primary x and y-gradient coils. The z-gradient coil is displaced sufficiently from the primary x and y-gradient coils that an air passage is defined therebetween.

In accordance with another aspect of the present invention, a self-shielded gradient coil is provided. An inner, cylindrical former defines an examination region therein. An x-gradient coil and a y-gradient coil are integrally bonded to the inner former. A z-gradient coil extends around and is spaced from the inner former and the x and y-gradient coils such that a generally annular cooling passage is defined therebetween. An outer former disposed around the z-gradient coil has x, y, and z shielding coils affixed thereto.

In accordance with another aspect of the present invention, a method of designing a self-shielding gradient coil is provided. The relative length of the primary and secondary x, y-gradient coils is adjusted until an integer turns ratio is achieved in their winding patterns.

In accordance with a more limited aspect of the present invention, a method of designing the z-gradient windings of the self-shielded gradient coil are provided. The radius of the z-gradient coil is iteratively adjusted, always having a radius at least 10 mm greater than the x, y primary gradient coils, until the primary and secondary z-gradient coil winding patterns have an integer turns ratio.

More specifically to the preferred embodiment, a radius and length is selected for the x, y primary gradient coils and a larger radius is selected for the secondary x, y gradient coils. The winding pattern for the primary and secondary gradient coils is determined. After comparing their turns ratio, the length of the primary x, y-gradient coil is adjusted and the winding patterns redesigned. This process is repeated until an integer turns ratio is achieved. Analogously, the radius and length of the primary and secondary z gradient coils are selected. After the winding pattern of primary and secondary z-gradient coils is determined, their turns ratios are compared. The radius of the primary z-gradient coil is adjusted and the z-coils are redesigned until the turns ratio is an integer.

In accordance with another aspect of the present invention, the gradient coil has a length and radius such that there is an integer relationship between the turns ratios of the primary and shield coils.

In accordance with a more limited aspect of the present invention, a method for designing self-shielded gradient coils is provided. First, the inner diameter, thickness, and maximum length of the coil are defined. Second, the minimum mean conductor radius of the x and y primary gradient coils is established along with the thickness and outer diameter. Having established the physical parameters of the x and y-coils, the mean conductor radius for the z primary coil is established, leaving at least a 10 mm gap for air flow between the inner diameter of the z-coil and the outer diameter of the x, y primary coil. Thereafter, the maximum outer diameter of this secondary coil assembly and its other physical dimensions are established. The mean conductor radius of the x, y, and z secondary coils are established. The z secondary is mounted on a former whose thickness, internal diameter, and maximum length are established. The former is larger in internal diameter than the outer diameter of the z primary coil. The x and y-coil designs are then optimized for minimum energy storage, and maximum shielding and linearity. The optimizing includes determining an energy minimized current distribution, adjusting the primary coil length to optimize shielding, and constraining the derivatives of the magnetic field to control linearity. Once the x and y-gradient coils are optimized, the z-gradient coil is optimized for shielding and linearity. Due to the higher efficiency of the z-coil, no energy minimization is necessary. However, the optimizing does include adjusting the primary z-coil radius to optimize shielding and constraining the derivatives to control linearity. In this manner, the design of the x, y, and z-gradient coil assembly is provided.

One advantage of the present invention resides in the improved thermal cooling of the gradient coils, particularly the x and y-gradient coils.

Another advantage of the present invention resides in the improved shielding characteristics.

Another advantage of the present invention is found in shorter gradient coils with improved linearity.

Another advantage of the present invention resides in its energy efficiency.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
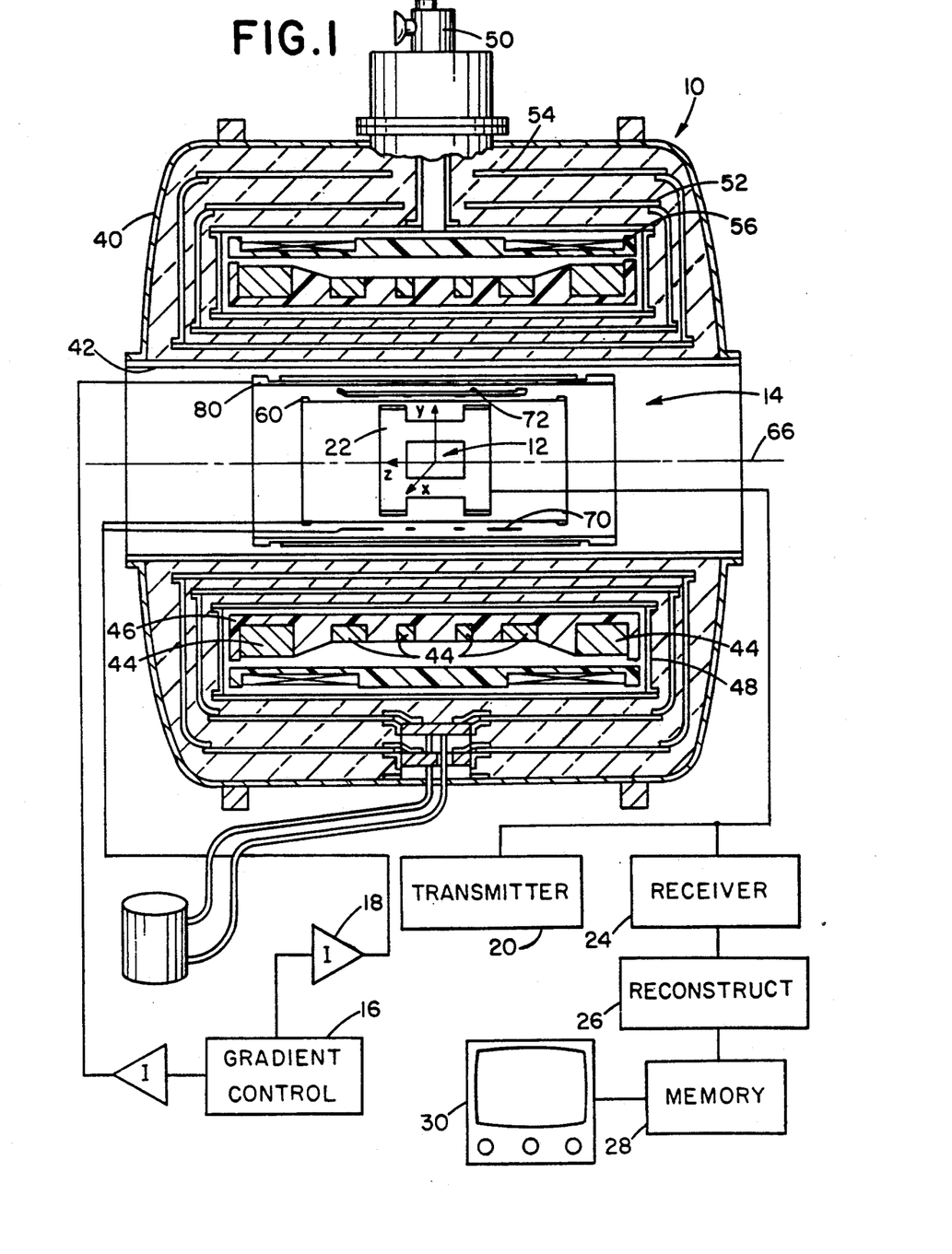
FIG. 1 is a vertical cross-sectional view of a magnetic resonance imaging apparatus through the vacuum envelope and various interior layers of a superconducting magnet.

With reference to FIG. 1, a superconducting main magnet field coil assembly 10 generates a substantially uniform magnetic field longitudinally through an examination region 12. A self-shielded gradient magnetic field coil assembly 14 selectively creates gradient magnetic fields across the examination region 12. A gradient magnetic field control means 16 controls a current pulse generator 18 to apply current pulses with selected characteristics to the gradient field coils to cause the desired magnetic field pulse to be generated.

A resonance excitation and manipulation means includes a radio frequency transmitter 20 for generating radio frequency pulses of the appropriate frequency and spectrum for inducing resonance of selected dipoles in the examination region 12. The radio frequency transmitter is connected with a radio frequency antenna 22 disposed surrounding the examination region and inside the gradient magnetic field coil assembly 14. The RF coil transmits radio frequency pulses into the region of interest and receives radio frequency resonance signals emanating therefrom. Alternately, a separate receiving coil may be provided. The received magnetic resonance signals are conveyed to a digital radio frequency receiver 24 for demodulation. The demodulated, digital radio frequency signals are reconstructed into a magnetic resonance image representation by an array processor or other image reconstruction means 26. The reconstructed image representation is stored in an image memory 28. The image representation may be displayed on a video monitor 30, subject to further processing, stored on tape or disk, or the like.

The superconducting magnet assembly 10 includes an outer vacuum vessel 40 which defines an inner, cylindrical room temperature bore 42 within which the gradient field coil assembly 14 is received. A series of superconducting, annular magnetic coils 44 are mounted on a dielectric former 46 and disposed within an annular helium reservoir 48. A helium port 50 permits the helium reservoir 48 to be maintained filled with liquid helium as it evaporates to hold the temperature within the helium vessel about 4.2° K. Preferably, a helium recovery and recirculating system (not shown) is interconnected with the helium port 50. The helium reservoir is surrounded by a first cold shield 52 which is cooled to about 20° K. or less. A second cold shield assembly 54, which is chilled to about 60°-70° K. or less, is disposed between the inner cold shield assembly and the vacuum vessel 40. In this way, a series of thermal gradations are maintained to minimize the evaporation of helium. A superconducting main magnetic field shield coil assembly 56 is mounted around the exterior of the superconducting magnet coils 44 and connected electrically in series therewith. The main field shield coil assembly 56 generates a magnetic field which opposes the fields generated by the main magnets 44 in the exterior of the cryostat, while producing a strong uniform magnetic field along the bore 42.

Figure 2:
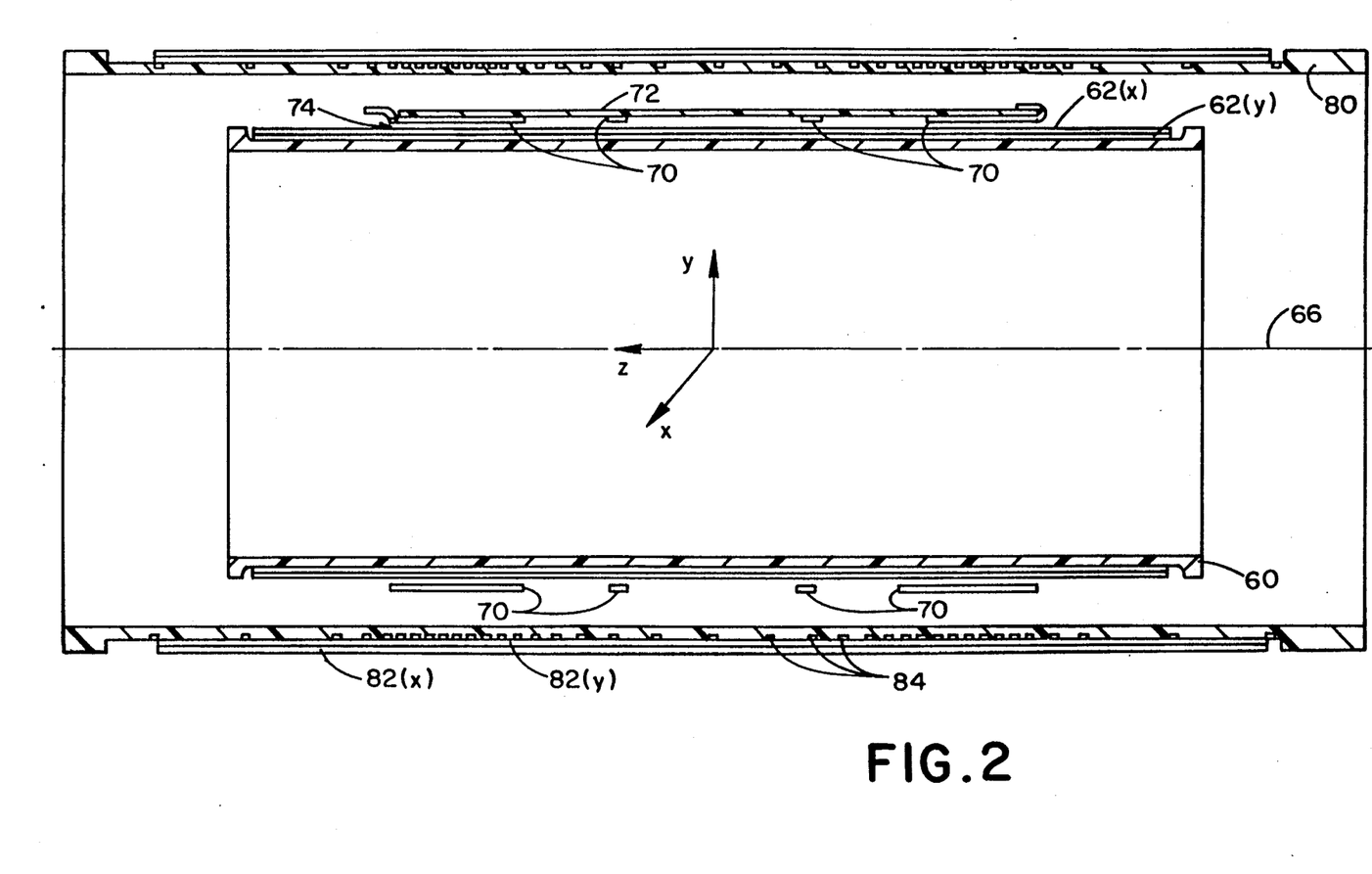
FIG. 2 is an enlarged, detailed view of the gradient coil assembly of FIG. 1.
Figure 3:
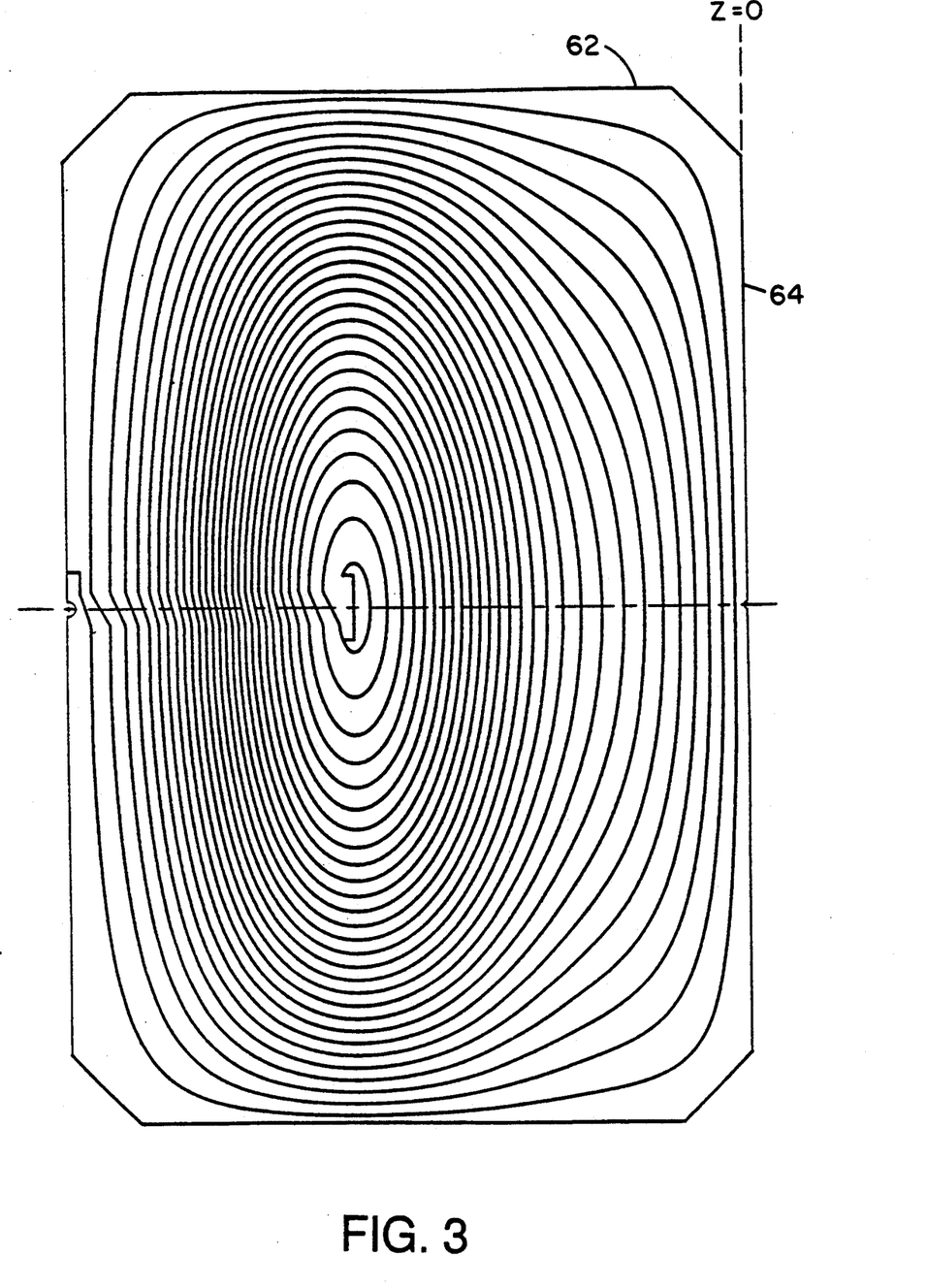
FIG. 3 is a diagrammatic illustration of one of four symmetric quadrants of a primary x or y-gradient coil laid out flat.

With particular reference to FIG. 2, the gradient coil assembly 14 includes an inner dielectric former 60 of radius a. Four x-gradient coils of the pattern illustrated in FIG. 3 are laminated to the cylindrical surface of the inner former 60. More specifically, for the x-gradient coil, the quadrant winding $62(x)$ of FIG. 3 is connected with a like quadrant winding along edge 64, which like quadrant winding is a mirror image of the quadrant winding 62. The pair of winding assemblies $62(x)$ are laminated with the edge 64 at the longitudinal center of the former 60 and extending peripherally therearound. A like pair of coils are mounted opposite the longitudinal center and mirror image to the pair of coils $62(x)$. The y-gradient coils also include four coil segments $62(y)$ which are of substantially the same construction. The y-gradient coils $62(y)$ are mounted to the former 60 but 90° rotated about a central axis 66 of the former relative to the x-gradient coils. The x and y-gradient windings are electrically insulated from each other and preferably potted in an epoxy. The windings may be manufactured from a relatively thin conductive sheet, such as copper or aluminum. The sheet may be cut before lamination to the former by water jet cutting or the like, and then bonded to a thin insulating substrate. In this way, the radial thickness is minimized.

Figure 4:
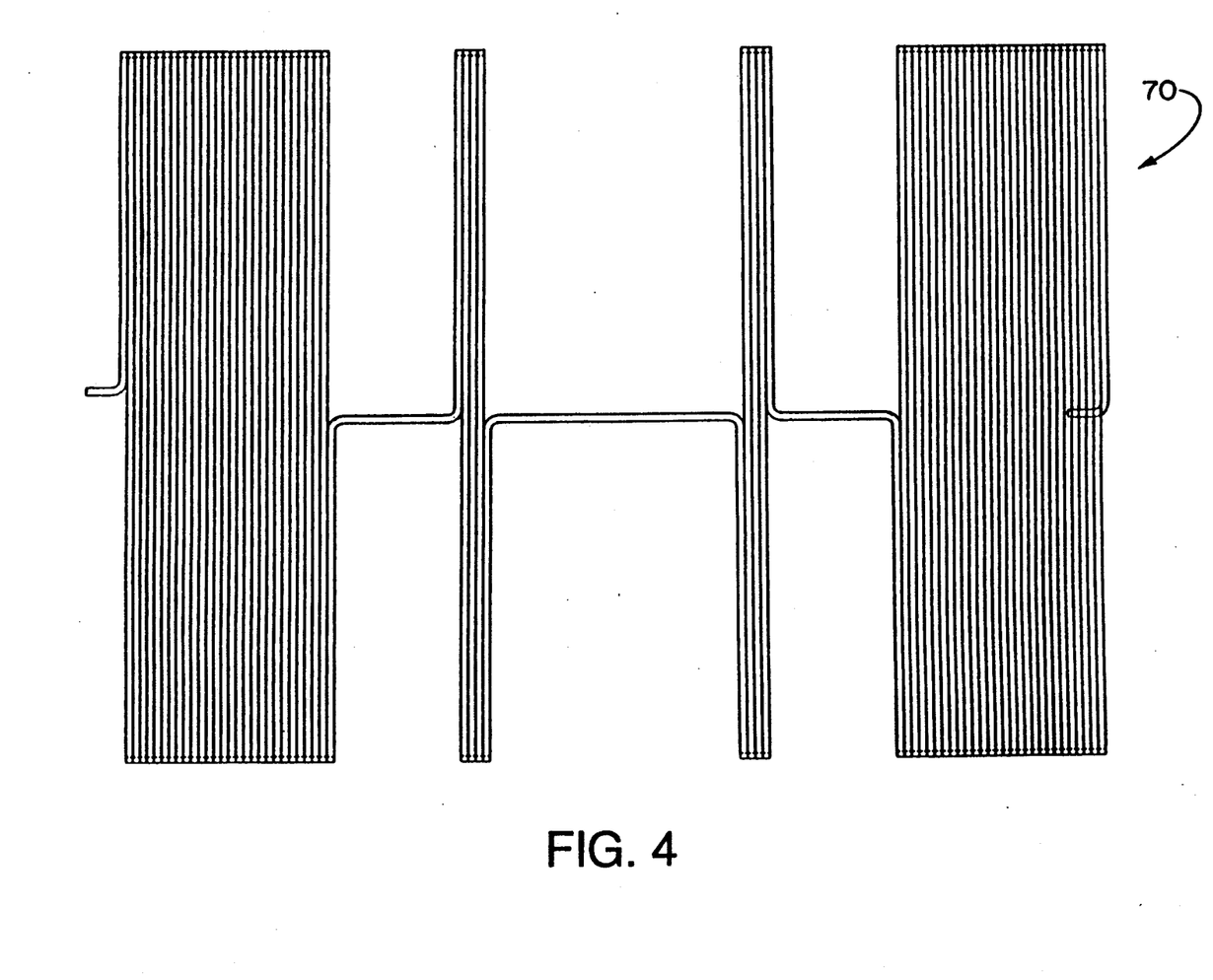
FIG. 4 is a top view of the primary z-gradient coil of FIG. 2.

A primary z-gradient coil 70 of the construction shown in FIG. 4 is constructed of a relatively stiff conductive material and connected with a series of mechanical positioning strips 72. The mechanical positioning strips 72 are arranged periodically around the former 60 and connected thereto with insulating posts, or the like, to hold the primary z-gradient coil 70 in a spaced relationship to the x-gradient coils. In this manner, an air passage 74 is defined between the primary z-gradient coil and the primary x and y-gradient coils, with additional air passages defined through the z-gradient coil.

Figure 5:
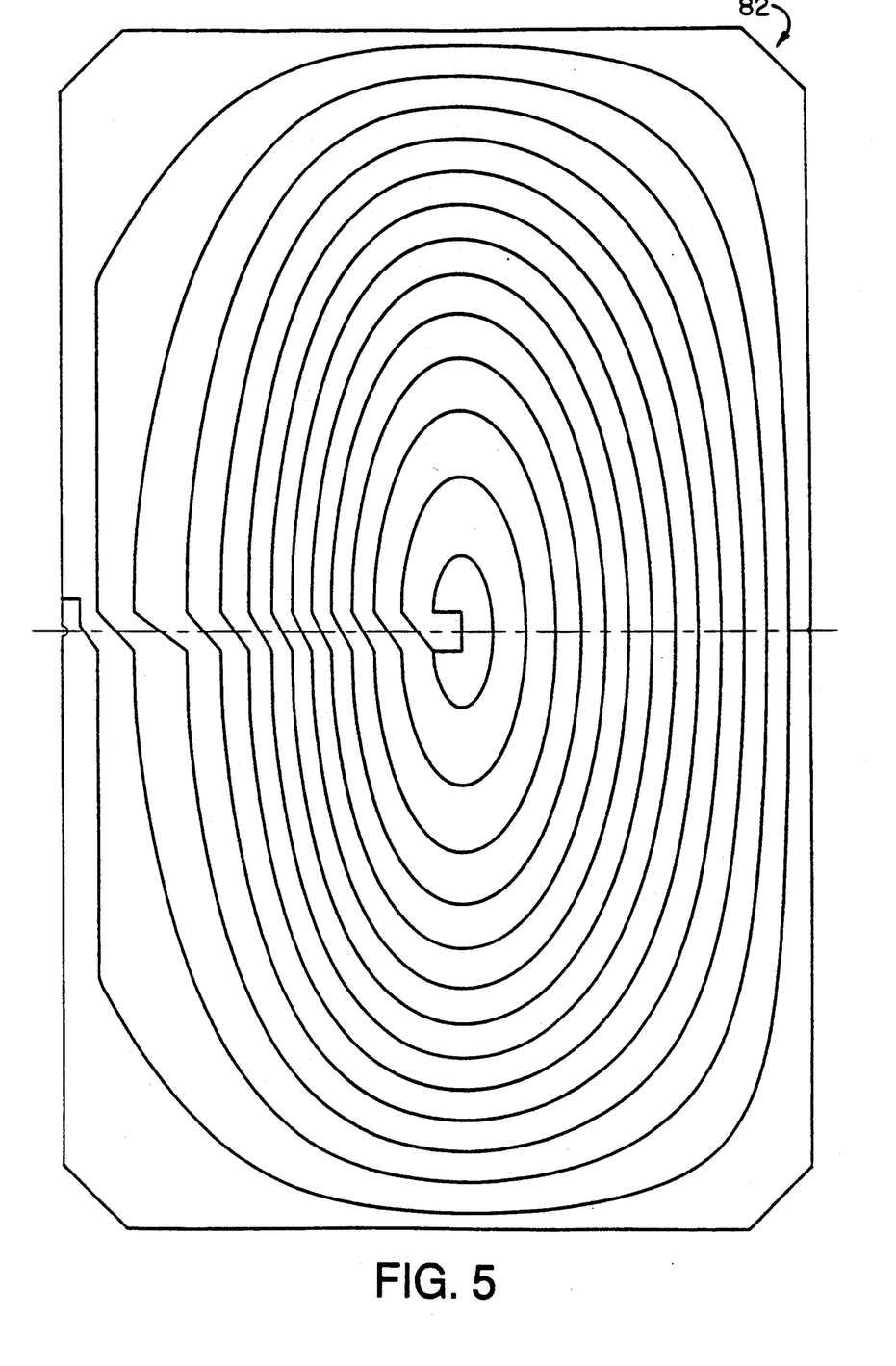
FIG. 5 is a diagrammatic illustration of one of four symmetric quadrants of a preferred x or y-gradient shield coil laid out flat.
Figure 6:
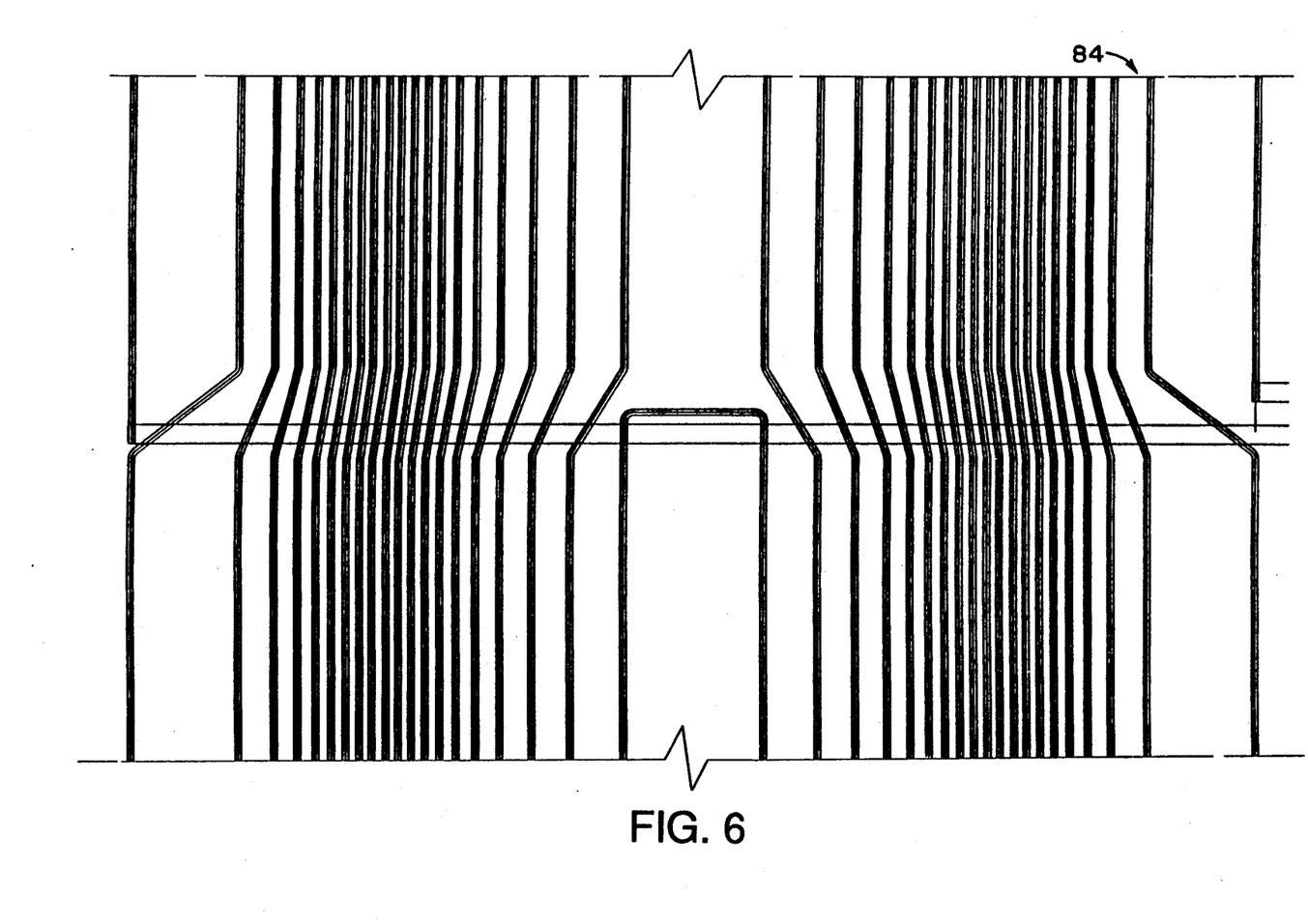
FIG. 6 is a diagrammatic illustration of the secondary z-gradient coil of FIG. 2 with the secondary z-gradient coil cut longitudinally and opened out flat; and, FIG. 7 is a block diagram of a preferred method of determining primary and secondary or shielding x, y, and z coil characteristics.

The former 60 is mounted by mechanical supporting means such as posts or vanes to a larger diameter shielding coil 80. The shielding gradient coil 80 has a series of shielding coils laminated to a surface thereof. These shielding coils include four symmetric x-gradient shielding coil assemblies $82(x)$ of the construction shown in FIG. 5 mounted substantially in alignment with the windings 62 of the primary x-gradient coil. The shield coil further includes four y-gradient shielding coil assemblies 82(y) also of the construction of FIG. 5, but of the quadrants mounted 90° offset relative to central axis 66 from the x-gradient shielding coil assemblies and substantially in alignment with the four primary y-gradient quadrant windings 62. The z-gradient coil construction 84 of the construction shown in FIG. 6 is mounted in corresponding grooves in the former 80. Because these shielding coils wrapped on former 80 have fewer turns and, therefore, much less resistance than the primary gradient coils wrapped on former 60, heat dissipation is not as great a concern. Accordingly, the x, y, and z-gradient coils are all laminated to the former 80 for spatial efficiency.

Figure 7:
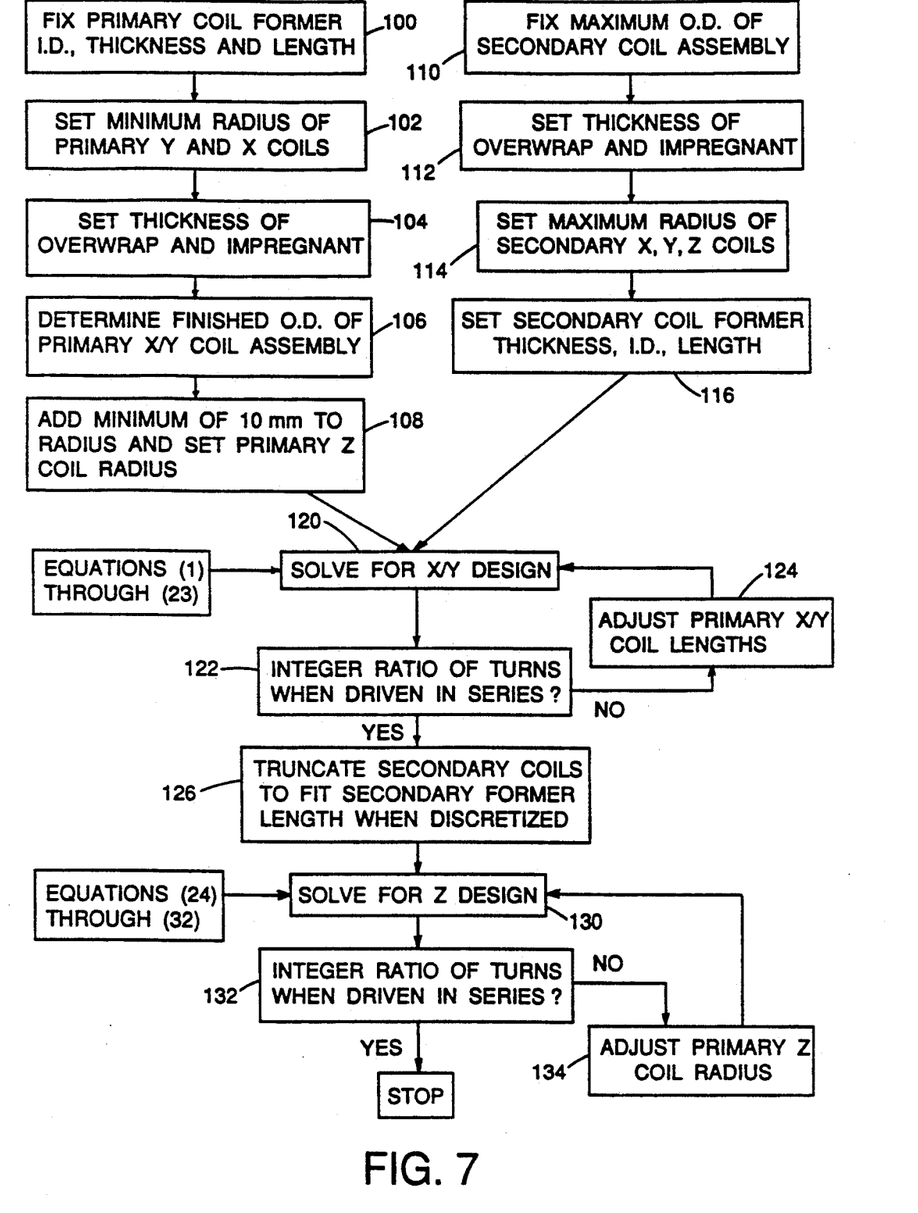

With reference to FIG. 7, first, the internal diameter, thickness, and length $L_1$ of the primary coil former are selected 100. From the dimensions of the primary coil former 60, a minimum radius a is set 102. The thickness of the overwrap and impregnating resin is selected 104, preferably as thin as possible while providing adequate dimensional stability and support. The finished outer diameter of the primary x and y-gradient coil assembly is determined 106. A radius of the primary z coil is determined 108 by adding a minimum of 10 mm to the outer radius of the finished primary x and y coil assembly.

The outer diameter of the secondary coil assembly is selected 110 to be as large as possible, provided the secondary coil fits within the bore 42. The thickness of the overwrap and impregnant which is necessary to provide the secondary coils with appropriate strength and stability is determined 112. From the dimensions with the overwrap, the maximum available radius for the secondary x, y, and z coils is determined 114. From the dimensions of the secondary x, y, and z coils, the dimensions of the secondary coil former 80 including its thickness, internal diameter, and length are determined 116.

Although the diameter of the primary x and y coils and secondary x, y, and z coils are set in accordance with the diameter of the bore and the diameter of the minimum acceptable patient receiving region within the coils, the coil patterns are not yet optimized. The design of the x and y-gradient and secondary coils is determined 120 using Equations (1)–(23) below. It will be noted that once the radii of the coils are selected, the discrete Fourier transform coefficients $j_\phi^a$ can be identified and the primary current distribution $J_\phi^a$ can be determined from Equations (1) and (2) below. The primary winding pattern is constrained to an inner former length $L_1$ in a mathematical sense, while the secondary is initially assumed to flow on an infinitely long cylinder. Next, the overall system of primary x and secondary x-gradient coil designs are optimized. Likewise, for the y-gradient, the magnetic energy $W_m$ is determined pursuant to Equation (12) below. The linear combination F of the stored energy and various derivatives of the axial component of the magnetic flux density is determined from Equation (13). Due to the symmetry, many of the derivatives can be set to zero. The derivative term is expanded, preferably using a Fourier-Bessel integral for $B_z$ as in Equation (10) and illustrated in Equation (14). With the derivative set to comply with the required characteristics, the function F is minimized with respect to the coefficients $j_n^a$ which ultimately define the winding pattern of both the primary and secondary x and y-gradient coils.

After the characteristics of the primary and secondary x and y-gradient coils are determined, a turns ratio of the primary and secondary x and y-gradient coils is determined and compared 122 to determine whether there is an integer ratio of turns when driven in series. If the turns ratio is not an integer, then the length $L_1$ of the primary x and y-gradient coils is adjusted 124 and the x and y-gradient coils are designed 120 again. This process is repeated iteratively until an integer turns ratio is achieved. Once an integer turns ratio is achieved, the length $L_2$ of the secondary coils is truncated in order to fit the length of the secondary former selected in step 116 when the coils are discretized. This is typically the length of the bore 42. The secondary coil length $L_2$ is longer, preferably at least 20% longer, than the selected length $L_1$ for the primary coils.

Once the primary and secondary x and y gradient coils design is fixed, the primary and secondary z-gradient coils are designed 130 using Equations (24)–(32) below. When designing the z-gradient coils, the adjustable variable is the radius of the primary z-gradient coil, rather than its length. As indicated in step 108, the primary z-gradient coil can have a range of diameters, provided that it is sufficiently larger than the x and y primary coils to provide a cooling air gap in between. More specifically, because the z-gradient coils store much less energy than the x and y-gradient coils, it is, as a practical matter, not necessary to determine the minimum energy storage characteristics of the z-gradient coil. It should be appreciated, however, that this does not preclude using the same type of approach in Equations (1)–(23) to design the z-coil. The magnetic flux density $B_z$ is determined pursuant to Equation (26). Its derivative in the z direction is determined pursuant to Equation (28). The various derivatives are set to zero or other values which obtain the selected z-gradient uniformity. In the preferred embodiment, the first derivative is the desired z-gradient. Higher order derivatives are considered undesirable and set to zero. The secondary z current $j_\phi^b$ is determined pursuant to Equation (29). Because the secondary z-gradient in the preferred embodiment is a bunched coil, the winding is discretized pursuant to Equation (30). The turns ratio of the primary and secondary z-coils is determined 132. The radius of the primary z-coil is adjusted 134 and the z-gradient coil design step 130 repeated. This process is repeated iteratively until an integer turns ratio is achieved.

As stated more mathematically, a continuous vector surface current density function of radius $\rho = a$ $$J_{100}^a(\phi,z), J_{100}^a(\phi,z)$$

is defined:

$$J_\phi^a(\phi,z) = \sum_{n=1}^{N} j_n^a \cos(k_n z)\cos\phi, \tag{1}$$

$$J_z^a(\phi,z) = \sum_{n=1}^{N} \frac{j_n^a}{k_n a} \sin(k_n z)\sin\phi, \tag{2}$$

where $$k_n = 2n\pi/L_1 \tag{3}$$

Their respective spatial Fourier transform coefficients $j_{100}{}^a(m,k), j_z{}^a(m,k)$ which are defined as:

$$j_\phi{}^a(m,k) = \frac{1}{2\pi} \int_{-\infty}^{\infty} \int_{-\pi}^{\pi} J_\phi{}^a(\phi,z) e^{-im\phi - ikz} d\phi dz \quad (4)$$

$$j_z{}^a(m,k) = \frac{1}{2\pi} \int_{-\infty}^{\infty} \int_{-\pi}^{\pi} J_z{}^a(\phi,z) e^{-im\phi - ikz} d\phi dz \quad (5)$$

and are given by:

$$j_\phi{}^a(\pm 1, k) = \frac{L_1}{4} \sum_{n=1}^{N} j_n{}^a \Psi_{\phi n}(k) \quad (6)$$

$$j_z{}^a(\pm 1, k) = \pm \frac{L_1}{4} \sum_{n=1}^{N} \frac{j_n{}^a}{k_n a} \Psi_{zn}(k), \quad (7)$$

where $$\Psi_{\phi n}(k) = \frac{\sin\{(k - k_n)L_1/2\}}{\{(k - k_n)L_1/2\}} + \frac{\sin\{(k + k_n)L_1/2\}}{\{(k + k_n)L_1/2\}} \quad (8)$$

$$\Psi_{zn}(k) = \frac{\sin\{(k - k_n)L_1/2\}}{\{(k - k_n)L_1/2\}} + \frac{\sin\{(k + k_n)L_1/2\}}{\{(k + k_n)L_1/2\}}. \quad (9)$$

With a superconducting cylindrical surface placed at radius $b > a$, the axial or z component of magnetic flux density $B_z$ generated by the current density $J_{100}{}^a, J_z{}^a$ within the cylindrical surface $\rho = a$ $$B_z(\rho,\phi,z) = -\frac{\mu_0 aL}{4\pi} \cos(\phi) \sum_{n=1}^{N} j_n{}^a \int_{-\infty}^{\infty} k\Psi_{\phi n}(k)\cos(kz) I_1(k\rho) K'_1(ka) S_1(a,b,k) dk, \quad (10)$$

$$S_1(a,b,k) = 1 - \frac{I_1(ka) K'_1(kb)}{I_1(kb) K'_1(ka)}. \quad (11)$$

The magnetic stored energy $W_m$ is:

$$W_m = -\frac{\mu_0 a^2 L^2}{16} \sum_{q=1}^{N} \sum_{n=1}^{N} j_q{}^a j_n{}^a \int_{-\infty}^{\infty} I_1(ka) K'_1(ka) \Psi_{\phi q}(k) \Psi_{\phi n}(k) S_1(a,b,k) dk. \quad (12)$$

These equations apply for x-gradients and are simply rotated by 90° to give the corresponding equations for the y-gradient. Due to the purity of the azimuthal behavior of the field, $\phi$ may be arbitrarily set to 0.

As a next step, a functional F is formed involving the magnetic stored energy and various derivatives of the axial component of magnetic flux density:

$$F = W_m - \sum_{j=1,3,\ldots} \sum_{p=0,2,\ldots} \lambda_{jp} \left( \frac{\partial^p \partial^j B_z}{\partial z^p \partial \rho^j} \bigg|_{\phi=\rho=z=0} - G_{jp}^c \right). \quad (13)$$

Due to symmetry, even-j and odd-p derivatives are naturally zero. Hence, these derivatives are not included in the above description of F. The constants $G_{jp}$ in this expression represent desired or constrained values of corresponding derivatives of the z-component of the magnetic field, $B_z$ and the $\lambda$'s represent undetermined Lagrange multipliers. One can show that:

$$\frac{\partial^p \partial^j B_z}{\partial z^p \partial \rho^j} \bigg|_{\phi=\rho=z=0} = -\frac{\mu_0 aL}{4\pi} \sum_{n=1}^{N} j_n{}^a (-1)^{p/2} \int_{-\infty}^{\infty} k^{p+j+1} \Psi_{\phi n}(k) I_1^{(j)}(0) K'_1(ka) S_1(a,b,k) dk. \quad (14)$$

It is worth noting that, for example, if the $p=0$, $j=5$ derivative is constrained to be zero, then all combinations of p and j which add to order 5 are implicitly zero (i.e. $[p,j] = [2,3], [4,1]$). For this reason, we arbitrarily set $p=0$ and constrain only odd-j derivatives. Of course, the $j=1$ derivative is just the desired (non-zero) gradient strength.

With this background, the final steps of the coil design method are described. The functional F is extremized with respect to the unknown coefficients $j_n{}^a$. A matrix equation results and is given by:

$$\sum_{q=1}^{N} j_q{}^a \left( \int_0^{\infty} I_1(ka) K'_1(ka) S_1(a,b,k) \Psi_{\phi q}(k) \Psi_{\phi n}(k) dk \right) = \quad (15)$$

$$\sum_j \lambda_j \left( \frac{2}{\pi aL} \int_0^{\infty} k^{j+1} \Psi_{\phi n}(k) I_1^{(j)}(0) K'_1(ka) S_1(a,b,k) dk \right)$$

for $n = 1, 2, \ldots, N$.
This is written in the compact form:

$$\sum_q j_q{}^a C_{nq} = \sum_j \lambda_j D_{jn} \quad (16)$$

for $n = 1, 2, \ldots, N$ or $$J^a = \Lambda D C^{-1} \quad (17).$$

Enforcing the constraints discussed above on the various derivatives gives an additional relation which can be written as:

$$G_j^c = -\frac{\mu_0 a^2 L^2}{4} \sum_{n=1}^{N} j_n{}^a D_{jn} \quad (18)$$

for $j = 1, 3, \ldots, J_{max}$ or $$G^c = -\frac{\mu_0 a^2 L^2}{4} J^a D^T. \quad (19)$$

The relations of Equations (17) and (19) are combined to give a solution for $\Lambda$ in the form:

$$\Lambda = -\frac{4}{\mu_o a^2 L_1^2} G^c (DC^{-1}D^T)^{-1}. \tag{20}$$

The shield current flowing on the cylinder of radius b is expressed as:

$$j_\phi^b(\pm 1, k) = -j_\phi^a(\pm 1, k) \frac{a\Gamma_1(ka)}{b\Gamma_1(kb)} \tag{21}$$

$$j_z^b(\pm 1, k) = \mp \frac{1}{kb} j_\phi^b(\pm 1, k) \tag{22}$$

Once the solutions for the continuous current density functions are in hand, we select a discrete conductor arrangement which substantially approximates these through discretization of stream functions $S^{a,b}$, whereby:

$$\mathbf{J}^{a,b} = \nabla \times \mathbf{S}^{a,b} \tag{23}$$

In a preferred embodiment, the solution $J^{a,b}$ is varied by adjusting the length $L_1$ of the primary coil until an integer number of contours of constant $S^{a,b}$ are obtained. This procedure ensures good shielding characteristics. In practice, the shield current extends farther than the primary current distribution and is apodized or truncated to produce a practical coil length.

In a preferred embodiment there are $N=4$ terms in the expansion for the currents and the $j=3$ and $j=5$ derivatives are set to zero. The $j=1$ derivative is constrained to the desired gradient strength.

The primary or inner z-gradient coil is preferably bunched and is modeled as a series of pulse surface currents flowing on a circular cylinder of radius a:

$$J_\phi^a(z) = \tag{24}$$

$$\sum_{q=1}^{Q} K_q \left\{ \begin{array}{l} \left( U\left(z - z_q + \frac{W_q}{2}\right) - U\left(z - z_q - \frac{W_q}{2}\right) \right) \\ - \left( U\left(z + z_q + \frac{W_q}{2}\right) - U\left(z + z_q - \frac{W_q}{2}\right) \right) \end{array} \right\},$$

where $K_q$ is the linear current density, $W_q$ the width and $\pm Z_q$ the axial positions of the q-th azimuthal sheet current. $U(\ )$ is a usual unit Heviside step function. Notice that the current sheets come as antisymmetric pairs. The spatial Fourier transform coefficients $j_\phi^a$ of this current distribution are given by:

$$j_\phi^a(k) = -i2 \sum_{q=1}^{Q} (K_q w_q)(kz_q) \text{Sinc}(kz_q) \text{Sinc}\left(\frac{kq_q}{2}\right). \tag{25}$$

It is noted that $K_q w_q$ is just the total q-th current, $I_q$. For a superconducting cylindrical surface at radius $b>a$, the expression for the axial or z-component of magnetic flux $B_z(\rho,z)$ density is:

$$B_z(\rho,z) = \frac{-\mu_o a}{2\pi} \int_{-\infty}^{\infty} k e^{ikz} j_\phi^a(k) S_0(a,b,k) K'_0(ka) I_0(k\rho) dk, \tag{26}$$

where $$S_0(a,b,k) = 1 - \frac{I_0(ka)K'_0(kb)}{I_0(kb)K'_0(ka)}. \tag{27}$$

From the Equation (26) expression for $B_z$, the j-th axial derivative of the field at the origin is obtained as follows (only odd-j derivatives are non-zero due to symmetry):

$$\frac{\partial^j B_z}{\partial z^j}\bigg|_{\rho=z=0} = \frac{-\mu_o a}{\pi} i^j \int_0^\infty k^{j+1} j_\phi^a(k) S_0(a,b,k) K'_0(ka) dk. \tag{28}$$

The $j=1$ derivative is just the desired gradient and the $j>1$ derivatives represent contaminants. In a preferred embodiment, there are two pairs of antisymmetric current sheets such that $I_2/I_1 = W_2/W_1 = 7$, $K_2 = K_1$ and $Z_2$ and $Z_1$ are chosen to give substantially zero $j=3$ and $j=5$ derivatives. The shielding current on the cylinder at radius b is given by:

$$j_\phi^b(k) = -j_\phi^a(k) \frac{a\Gamma_0(ka)}{b\Gamma_0(kb)} \tag{29}$$

which is inverse Fourier transformed to give the current distribution $J_{100}{}^b$ in the spatial domain, i.e. the physical coil winding pattern.

In a preferred embodiment, the shield current distribution is discretized using conductors of constant crosssection and is driven in series with the primary coil. The positions, for $z>0$ are determined using a center-of-mass definition as follows:

$$z_m = \frac{1}{-I_{peak}} \int_{z_{m-}}^{z_{m+}} z J_\phi^b(z) dz, \tag{30}$$

where $$\int_{z_{m-}}^{z_{m+}} J_\phi^b(z) dz = -I_{peak} \tag{31}$$

$m = 1, 2, \ldots, M$.

The value of M is set to the nearest integer of the quantity:

$$\left\{ -\int_0^{Z_\infty} J_\phi^b(z) dz \right\} / I_{peak}. \tag{32}$$

The upper bound is set large enough that the value of $J(z)$ is substantially zero beyond this point. In a preferred embodiment, and for the purpose of giving optimal shielding characteristics, the radius a (or b, or both) is adjusted so that the quantity of Equation (32) is an integer value.

In an alternate embodiment, the z primary current is not assumed to be a series of pulse sheet currents, but instead is allowed to be a Fourier series-type function similar to the Y/X case. The same constrained energy minimization procedure is then followed to design the z-gradient. In this alternate embodiment, the z primary current is distributed and similar relations for its discretization to that described above are developed. Again, the radii a and b are preferably adjusted to give an integer number of turns for both the primary and shield coils for optimal shielding.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A magnetic resonance imaging system comprising:
   an annular vacuum chamber which defines a cylindrical inner bore therein;
   an annular helium reservoir disposed within the vacuum chamber surrounding and displaced from the central bore thereof;
   a superconducting primary magnetic field coil disposed within the helium chamber for generating a substantially uniform magnetic field longitudinally through the central bore;
   a self-shielded gradient coil assembly disposed in the central bore for generating gradient magnetic fields across a central region thereof and for shielding the vacuum chamber, the helium reservoir, and other components within the vacuum chamber from the generated gradient field magnetic fields such that eddy currents are not induced in the vacuum chamber or the contained associated structure, which eddy currents would tend to generate spurious magnetic fields within the bore, the self-shielded gradient coil assembly including:
   an outer former on which x, y, and z secondary shielding coils are mounted, the outer former being received within the bore proximate thereto;
   an inner former received in and spaced from the outer former, the inner former defining a subject receiving region therein for receiving a portion of a subject to be imaged therein;
   primary x and y-gradient coils being mounted to the inner former for generating gradients across an examination region in the inner former orthogonal to a central axis of the vacuum chamber inner bore;
   a z-gradient coil spaced outward from the inner former and the primary x and y-gradient coils and mounted inward from the outer former for generating magnetic field gradients along the central axis of the vacuum chamber inner bore, the z-gradient coil being displaced from the primary x and y-gradient coils to define a passage therebetween;
   a radio frequency coil disposed within the vacuum chamber inner former;
   a gradient control means for selectively causing electrical pulses to be applied to the x, y, and z primary gradient coils for inducing magnetic gradient pulses across the examination region;
   a radio frequency transmitter for applying radio frequency pulses to the radio frequency coil for exciting and manipulating magnetic resonance of selected dipoles within the examination region;
   a receiver means for receiving and demodulating magnetic resonance signals emanating from the examination region;
   a reconstruction means for reconstructing the demodulated magnetic resonance signals into an image representation.

2. A self-shielded gradient coil for a magnetic resonance system comprising:
   an inner, tubular former which defines an examination region therein;
   an x-gradient coil and a y-gradient coil integrally bonded to the inner former;
   a z-gradient coil extending around and spaced from the inner former and the x and y-gradient coils such that a generally annular cooling passage is defined therebetween;
   an outer tubular former disposed around the z-gradient coil; and,
   x, y, and z shielding coils affixed to the outer former.

3. The self-shielded coil assembly as set forth in claim 2 wherein the primary and secondary z-gradient windings are bunched winding patterns.

4. The self-shielded coil assembly as set forth in claim 2 wherein the inner former has a length and a diameter selected such that the x and y-gradient coils achieve preselected x and y-gradient fields with an integer number of turns.

5. The self-shielded gradient coil assembly as set forth in claim 4 wherein the diameter of the outer former is selected such that the x and y secondary coil windings shield the x and y-gradient fields from the primary x and y-gradient coils with an integer number of windings, when driven with the same current amplitude as the primary x and y-gradient coils.

6. The self-shielded coil assembly as set forth in claim 2 wherein at least the z-gradient coil and the z shielding coil have radii such that there is an integer relationship between their turns ratios.

7. A method of designing a self-shielded gradient coil, the method comprising:
   selecting a radius for a primary gradient coil and a radius for a secondary, shielding gradient coil;
   designing a primary gradient coil pattern which achieves a preselected flux density and designing a corresponding secondary gradient coil;
   comparing a turns ratio of the primary and secondary gradient coils;
   iteratively (i) adjusting a length of the primary gradient coil, (ii) redesigning for the primary gradient coil to achieve the preselected flux density, (iii) redesigning the corresponding secondary gradient coil, and (iv) determining the turns ratio until an integer turns ratio is achieved;
   truncating the secondary gradients coil to a length about 20% longer than the length of the primary gradient coil.

8. In a magnetic resonance imaging system, self-shielded x and y gradient coils constructed by the method of claim 7.

9. A method of designing a self-shielding gradient coil for a magnetic resonance imaging apparatus, the method comprising:
   selecting an inner diameter, thickness, and maximum length of the self-shielding gradient coil;
   selecting a mean conductor radius for an x primary coil and a y primary coil;
   designating an outer diameter of the x and y primary coils and an associating supporting structure;
   selecting a mean z gradient coil radius which is at least 10 mm larger than said outer diameter;

setting a maximum outer diameter, thickness, and length of a secondary coil assembly;
establishing mean conductor radii of x, y, and z secondary coils;
determining an energy minimized current distribution of x and y coil patterns and adjusting the length of the primary coil assembly to optimize shielding while constraining derivatives of the magnetic field in order to control linearity;
iteratively adjusting x and y coil patterns and adjusting the primary coil length until a minimum energy storage and maximum shielding and linearity are attained;
adjusting the primary z gradient coil radius to optimize shielding while constraining derivatives of the magnetic field to control linearity.

10. A method of designing self-shielded gradient coils for magnetic resonance imaging apparatus, the method comprising:
selecting a diameter and length of a primary x, y-gradient coil in accordance with a selected diameter of an examination region therein;
selecting a diameter of a secondary, shielding x, y-gradient coil in accordance with an inner diameter of a bore of the magnetic resonance apparatus;
iteratively adjusting a length of the primary coil and recalculating discrete winding patterns which achieve a preselected current density in the primary gradient coil until the primary and secondary gradient coils have an integer turns ratio;
selecting a diameter and length of a primary z-gradient coil, the primary z-gradient coil having a radius at least 10 mm larger than the primary x, y-gradient coil to provide a cooling air gap therebetween;
selecting a radius and length of a secondary, shielding z-gradient coil, the length and diameter of the secondary z-gradient coil corresponding generally to the radius and length of the secondary x, y-gradient coil;
iteratively adjusting the radius of the primary z-gradient coil and determining discrete z-gradient primary and secondary coil winding patterns until an integer turns ratio between the primary and secondary z-gradient coil winding patterns is achieved.

* * * * *